United States Patent
Yoon et al.

(10) Patent No.: US 10,079,089 B1
(45) Date of Patent: Sep. 18, 2018

(54) COIL ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Chan Yoon, Suwon-si (KR); Dong Hwan Lee, Suwon-si (KR); Young Ghyu Ahn, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/721,170

(22) Filed: Sep. 29, 2017

(30) Foreign Application Priority Data

Mar. 15, 2017 (KR) .................. 10-2017-0032660

(51) Int. Cl.
*H01F 27/28* (2006.01)
*H05K 1/18* (2006.01)
*H01F 27/255* (2006.01)

(52) U.S. Cl.
CPC ....... *H01F 27/2804* (2013.01); *H01F 27/255* (2013.01); *H05K 1/181* (2013.01); *H01F 2027/2809* (2013.01); *H05K 2201/1003* (2013.01)

(58) Field of Classification Search
CPC .......... H01F 27/28; H01F 27/29; H01F 27/30; H01F 27/255
USPC ........ 174/260; 336/192, 198, 200, 208, 221, 336/233; 323/282
See application file for complete search history.

(56) References Cited

U.S. PATENT DOCUMENTS

| | | | | |
|---|---|---|---|---|
| 7,230,428 B1* | 6/2007 | Ishii | ................... | G01R 33/3678 324/318 |
| 2007/0171023 A1* | 7/2007 | Ikezawa | ................ | H01F 27/325 336/208 |
| 2009/0108977 A1* | 4/2009 | Chen | ..................... | H01F 27/346 336/198 |
| 2011/0050191 A1* | 3/2011 | Tsuji | ................... | H01F 17/0006 323/282 |
| 2012/0001713 A1* | 1/2012 | Park | ...................... | H01F 27/325 336/192 |
| 2012/0001716 A1* | 1/2012 | Park | ...................... | H01F 27/325 336/221 |
| 2013/0002385 A1* | 1/2013 | Kwon | ..................... | H01F 27/29 336/192 |
| 2014/0002227 A1* | 1/2014 | Hsieh | .................... | H01F 27/022 336/200 |
| 2014/0022041 A1 | 1/2014 | Park et al. | | |
| 2016/0042858 A1 | 2/2016 | Park et al. | | |

(Continued)

FOREIGN PATENT DOCUMENTS

| KR | 10-2014-0011693 A | 1/2014 |
|---|---|---|
| KR | 10-2016-0019265 A | 2/2016 |

*Primary Examiner* — Xiaoliang Chen
(74) *Attorney, Agent, or Firm* — McDermott Will & Emery LLP

(57) ABSTRACT

A coil electronic component includes: a body; first and second external electrodes disposed on opposite surfaces of the body in a first direction parallel to a mounting surface of the body; a support member disposed in a second direction, perpendicular to the mounting surface of the body and including a protrusion portion extending in the second direction; and a coil disposed on at least one surface of the support member.

12 Claims, 3 Drawing Sheets

(56) References Cited

U.S. PATENT DOCUMENTS

2016/0293319 A1* 10/2016 Hong .................... H01F 27/255
2016/0336107 A1* 11/2016 Choi ................... H01F 17/0013
2017/0032884 A1* 2/2017 Choi ................... H01F 17/0013
2017/0133149 A1* 5/2017 Hsieh ..................... H01F 27/29

* cited by examiner

COIL ELECTRONIC COMPONENT AND BOARD HAVING THE SAME

CROSS-REFERENCE TO RELATED APPLICATION(S)

This application claims priority to Korean Patent Application No. 10-2017-0032660 filed on Mar. 15, 2017, in the Korean Intellectual Property Office (KIPO), the disclosure of which is incorporated herein by reference in its entirety.

BACKGROUND

1. Field

The present disclosure relates to a coil electronic component and a board having the same.

2. Description of Related Art

An inductor, a coil electronic component, is a representative passive element forming an electronic circuit together with a resistor and a capacitor to remove noise. The inductor is combined with the capacitor using electromagnetic characteristics to configure a resonance circuit amplifying a signal in a specific frequency band, a filter circuit, or the like.

As electronic devices, such as various communications devices, display devices, or the like, are being miniaturized and made thinner at an increasing rate, research into a technology for miniaturizing and thinning various elements such as an inductor, a capacitor, a transistor, and the like, used in these devices has been continuously conducted. Therefore, the inductor has also been rapidly replaced by an inductor having a small size and high density, capable of being automatically surface-mounted, and a thin film type inductor in which a mixture of magnetic powder particles and a resin is formed on coil patterns formed on upper and lower surfaces of a thin film insulation substrate by plating has been developed.

SUMMARY

An aspect of the present disclosure may provide a coil electronic component in which a direction in which a coil is disposed may be determined from external to the coil electronic component.

According to an aspect of the present disclosure, there is provided a coil electronic component having a body, first and second external electrodes disposed on opposite surfaces of the body in a first direction parallel to a mounting surface of the body a support member disposed in a second direction, perpendicular to the mounting surface of the body and including a protrusion portion extending in the second direction, and a coil disposed on at least one surface of the support member.

According to another aspect of the present disclosure, there is provided an electronic circuit having a circuit board including a first surface having first and second terminals, and a coil electronic component disposed on the circuit board. The coil electronic component may include a body, first and second external electrodes disposed on opposite surfaces of the body in a first direction parallel to a mounting surface of the body, a support member disposed in a second direction, perpendicular to the mounting surface of the body and including a protrusion portion extending in the second direction, and a coil disposed on at least one surface of the support member.

BRIEF DESCRIPTION OF DRAWINGS

The accompanying drawings, which are included to provide further understanding and are incorporated in and constitute apart of this specification, illustrate disclosed embodiments and together with the description serve to explain the principles of the disclosed embodiments. In the drawings.

DETAILED DESCRIPTION

Hereinafter, exemplary embodiments of the present disclosure will now be described in detail with reference to the accompanying drawings.

X, Y, and Z directions illustrated in the accompanying drawings may refer to length, width, and thickness directions, respectively, but are not limited thereto. For example, based on a mounting surface of a body, a direction parallel to the mounting surface of the body may refer to a first direction (L direction), a direction perpendicular to the mounting surface of the body may refer to a second direction (T direction), and a direction perpendicular to the first and second directions may refer to a third direction (W direction).

For the sake of discussion, an inductor is described as an example coil electronic component. However, embodiments disclosed are equally applicable to other coil electronic components such as a common mode filter, general beads, high-frequency beads (GHz beads), and the like, without departing from the scope of the disclosure.

Figure 1:
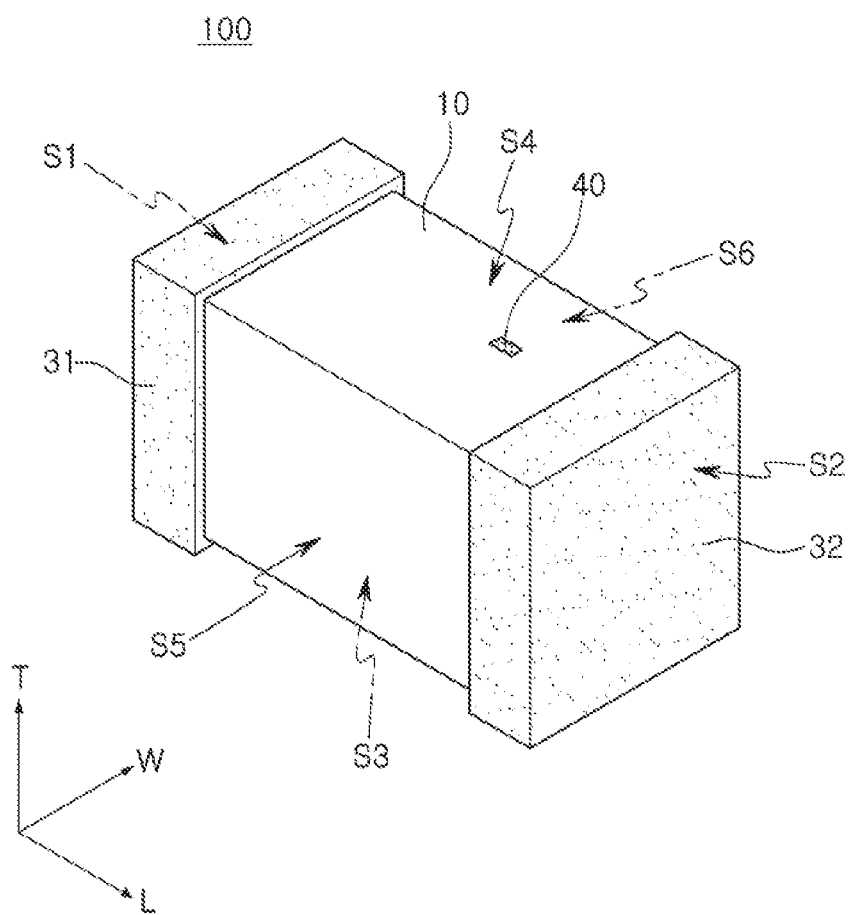
FIG. 1 is a perspective view of a coil electronic component according to an exemplary embodiment.
Figure 2:
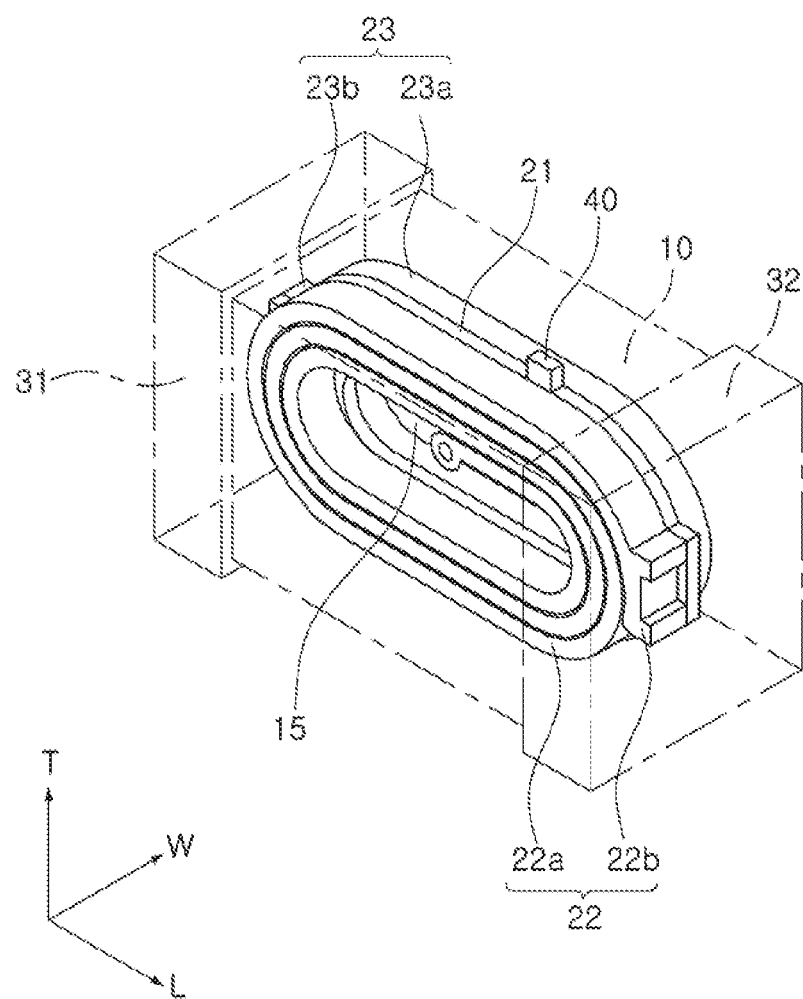
FIG. 2 is a perspective view of the coil electronic component of FIG. 1 and the internal structure thereof, according to an exemplary embodiment.

FIG. 1 is a perspective view of a coil electronic component 100 according to an exemplary embodiment of the present disclosure, and FIG. 2 is a perspective view illustrating the internal structure of the coil electronic component 100 according to an exemplary embodiment.

Referring to FIGS. 1 and 2, the coil electronic component 100 may include a body 10 having a support member 21 arranged generally centrally therein in the L-direction, first and second coil conductors 22 and 23 (collectively referred to hereinafter as the coil) disposed on opposite surfaces of the support member 21, and external electrodes 31 and 32.

The body 10 may form an exterior of the coil electronic component 100. The body 10 may have first and second surfaces S1 and S2 opposing each other in the first direction (or the L-direction), third and fourth surfaces S3 and S4 opposing each other in the second direction (or the T-direction), and fifth and sixth surfaces S5 and S6 opposing each other in the third direction (or the W-direction), to thereby have a substantially hexahedral shape. However, the shape of the body 10 is not limited thereto, and the body 10 may have a desired shape based on the application and design requirement and without departing from the scope of the disclosure. A dimension (or extent) of the body 10 in the third (W) direction perpendicular to the first (L) and second (T) directions may be longer than a dimension of the body in the second (T) direction. However, in other examples, the dimension of the body 10 in the third (W) direction may be equal to that of the body 10 in the second (T) direction. Particularly, in a case in which the dimension of the body 10 in the third (W) direction is equal to that of the body 10 in the second (T) direction, it may be difficult to externally confirm an orientation and/or placement of the coil (coil conductors 22 and 23) disposed in the coil electronic component 100. Stated otherwise, because there is little difference between the extent of the body 10 in the W-direction and the T-direction, it may be difficult to differentiate between the W-direction and the T-direction based on the external dimensions of the body 10.

The body 10 may contain a magnetic material. The magnetic material is not limited to any particular material as long as it has magnetic properties. Examples of the magnetic material may include pure iron powder; Fe alloys such as Fe—Si based alloy powder, Fe—Si—Al based alloy powder, Fe—Ni based alloy powder, Fe—Ni—Mo based alloy powder, Fe—Ni—Mo—Cu based alloy powder, Fe—Co based alloy powder, Fe—Ni—Co based alloy powder, Fe—Cr based alloy powder, Fe—Cr—Si based alloy powder, Fe—Ni—Cr based alloy powder, Fe—Cr—Al based alloy powder; amorphous alloys such as an Fe based amorphous alloy, a Co based amorphous alloy, or the like; spinel type ferrites such as Mg—Zn based ferrite, Mn—Zn based ferrite, Mn—Mg based ferrite, Cu—Zn based ferrite, Mg—Mn—Sr based ferrite, Ni—Zn based ferrite; hexagonal ferrites such as Ba—Zn based ferrite, Ba—Mg based ferrite, Ba—Ni based ferrite, Ba—Co based ferrite, Ba—Ni—Co based ferrite; garnet ferrites such as Y based ferrite; a combination thereof and the like.

The magnetic material may include metal magnetic powder and a resin mixture. The metal magnetic powder may contain iron (Fe), chromium (Cr), or silicon (Si) as a main ingredient. For example, the metal magnetic powder may contain iron (Fe)-nickel (Ni), iron (Fe), iron (Fe)-chromium (Cr)-silicon (Si), or the like, but is not limited thereto. A resin may include epoxy, polyimide, a liquid crystal polymer (LCP), or the like, or a mixture thereof, but is not limited thereto. As the magnetic material, a magnetic material-resin composite formed by filling metal magnetic powder particles having at least two average particle sizes $D_1$ and $D_2$ in the resin may also be used. In this case, the magnetic material-resin composite may be filled using bimodal metal magnetic powder particles having different sizes and compressing the bimodal metal magnetic powder particles, such that a filling rate may be increased.

The body 10 may be formed by molding the magnetic material-resin composite containing the metal magnetic powder and the resin mixture in a sheet form and compressing and curing the molded composite on and below the first and second coil conductors 22 and 23, but is not necessarily limited thereto.

Here, coils formed as the first and second coil conductors 22 and 23 may be disposed perpendicular to a mounting surface of the coil electronic component 100 by allowing a stacking direction of the magnetic material-resin composite to be in parallel to the mounting surface of the coil electronic component 100. Here, the stacking direction is perpendicular to the mounting surface, which includes a case in which an angle between the stacking direction and the mounting surface is substantially 90°, that is, about 60° to 120° as well as a case in which the angle therebetween is perfectly 90°.

The support member 21 may be provided in the body 10 to perform a function of supporting the first and second coil conductors 22 and 23, or the like, and be formed of, for example, a polypropylene glycol (PPG) substrate, a ferrite substrate, a metal based soft magnetic substrate, a combination thereof and the like. In this case, a through hole may be formed in a central region of the support member 21, and the same material as the material forming the body 10 may be filled in the through hole to form a core part 15. The core part 15 may configure a part of the body 10.

As illustrated, the first and second coil conductors 22 and 23 may be formed or otherwise arranged on opposite surfaces of the support member 21 in the W-direction. The first and second coil conductors 22 and 23 may be formed in a spiral shape, and electrically connected to each other through an internal via penetrating through the support member 21. The first and second coil conductors 22 and 23 may include first and second inductance portions 22a and 23a formed of spiral electrodes, respectively, and outermost portions of the first and second coil conductors 22 and 23 may be provided with first and second lead portions 22b and 23b exposed externally from the body 10 for electrical connection with the first and second external electrodes 31 and 32, respectively. The first and second lead portions 22b and 23b may be exposed on the surfaces S2 and S1 of the body 10, respectively. The first and second lead portions 22b and 23b may be formed integrally with the respective first second coil conductors 22 and 23 to form portions of outermost regions of the first and second coil conductors 22 and 23. The first and second coil conductors 22 and 23 may be electrically connected to each other through the internal via to form a single coil, but embodiments are not limited thereto. For example, a coil may also be formed by forming a coil conductor only on one surface of the support member 21 and allowing both end portions of this coil conductor to be connected to the first and second external electrodes through lead portions, respectively.

The first and second coil conductors 22 and 23 may include a material such as a metal or the like having improved electric conductivity. For example, the first and second coil conductors 22 and 23 may be or include silver (Ag), palladium (Pd), aluminum (Al), nickel (Ni), titanium (Ti), gold (Au), copper (Cu), platinum (Pt), an alloy thereof, or the like. In this case, electroplating method may be used for manufacturing the first and second coil conductors in a thin film shape. However, other methods known in the art may also be used in place of electroplating as long as an effect similar to that of the electroplating method may be implemented.

The first and second external electrodes 31 and 32 may electrically connect the coil electronic component 100 to a circuit board, or the like, when the coil electronic component 100 is mounted on the circuit board, or the like.

The first and second external electrodes 31 and 32 may be formed by plating. The thicknesses of the first and second external electrodes 31 and 32 may be adjusted with relative ease and the first and second external electrodes 31 and 32 may be made relatively less thick. As a result, a volume of the body 10 may be increased, and inductance, direct current resistance characteristics, efficiency, and the like, may be improved.

The first and second external electrodes 31 and 32 may include a conductive material. For example, the first and second external electrodes 31 and 32 may include silver (Ag), palladium (Pd), aluminum (Al), nickel (Ni), titanium (Ti), gold (Au), copper (Cu), platinum (Pt), tin (Sn), an alloy thereof, or the like. In an example, the first and second external electrodes 31 and 32 may be formed by plating, and the first and second external electrodes 31 and 32 may not include a glass ingredient and/or a resin.

Referring to FIGS. 1 and 2, the coil electronic component 100 according to the exemplary embodiment may include a protrusion portion 40.

Given the recent trends in miniaturization and thinness of electronic devices, a size of a body of a coil electronic component has been decreased from 2520 & 1.0 t (2.5 mm(L)×2.0 mm(W)×1.0 mm(T)) to 1608 & 0.8 t (1.6 mm(L)×0.8 mm(W)×0.8 mm(T)), and may be decreased up to 1005 & 0.5 t (1.0 mm(L)×0.5 mm(W)×0.5 mm(T)) in the future.

Based on the miniaturization trends discussed above, it may be understood that, among the dimensions of the body, a length (L) and a width (W) of the body may be decreased relatively more as compared to a thickness (T) of the body, and this may increase a mounting density of the coil electronic component.

According to the related art, a support member is disposed parallel to a mounting surface (e.g., the surface including the L×W plane) of the body of the coil electronic component, and a coil is disposed on the support member. Therefore, based on the miniaturization trends of the coil electronic component, it may be possible to decrease a length (L) and a width (W) of the body relatively more, and there may be a limitation in securing desired inductance (L) and Q value of the coil electronic component and low resistance.

In example embodiment, by disposing the support member 21 perpendicular to the mounting surface of the body, in other words, in parallel to a L×T plane or W×T plane (FIG. 1), an area on which the coil may be disposed may be increased. Also, by disposing the coil in such a manner, an area of the core inside the coil may be increased, and a distance between an outermost surface of the coil and an outer surface (e.g., S5 and S6) of the body 10 may be increased, and improved performance may be obtained.

However, when disposing a support member 21 and the coil perpendicular to a mounting surface of an inductor, in other words, parallel to the a L×T plane or W×T plane (FIG. 1), the placement and orientation of the coil in the body may be determined externally (e.g., from an exterior view of the body) using a marking (or similar) on the body.

According to the related art, in a case of a coil electronic component including a coil in parallel to a mounting surface of a body, the coil electronic component is completed by forming a coil array, stacking and compressing magnetic sheets to form a laminate, printing a marking on an external surface of the laminate in a stacking direction in order to distinguish a direction of a magnetic flux generated by a current flowing in a coil, dicing the laminate to form each of the bodies, and forming external electrodes on an outer portion of the body.

Since in the coil electronic component 100 according to the exemplary embodiment, the support member 21 is shaped like a plate and disposed in an upright manner in the second (T) direction perpendicular to the mounting surface of the body 10 and the support member 21 includes the protrusion portion 40 extended in the second (T) direction, it may be possible to determine a direction of a magnetic flux of the coil electronic component 100 based on the placement and orientation of the protrusion portion 40.

The protrusion portion 40 may be at least partially exposed externally of the body 10. For example, when the third surface S3 of the body 10 is the mounting surface, the protrusion portion 40 may be at least partially exposed to the fourth surface S4 of the body 10.

Here, the protrusion portion 40 may be offset from the center of the fourth surface S4 in the first (L) direction, such that it may be possible to determine the direction of the magnetic flux of the coil electronic component 100 using the protrusion portion 40.

Particularly, the fourth surface S4 of the body 10 may be diced during a dicing step in a manufacturing process of the coil electronic component 100, and in the coil electronic component 100 according to the exemplary embodiment, the protrusion portion 40 may be exposed to the fourth surface S4 without requiring a separate process and may thus serve as an indicator or marking.

Further, when the body 10 may have a same dimension in the second (T) and third (W) directions, it may be possible to distinguish a placement and orientation of the coil or the direction of the magnetic flux based on the placement of the protrusion portion 40.

Figure 3:
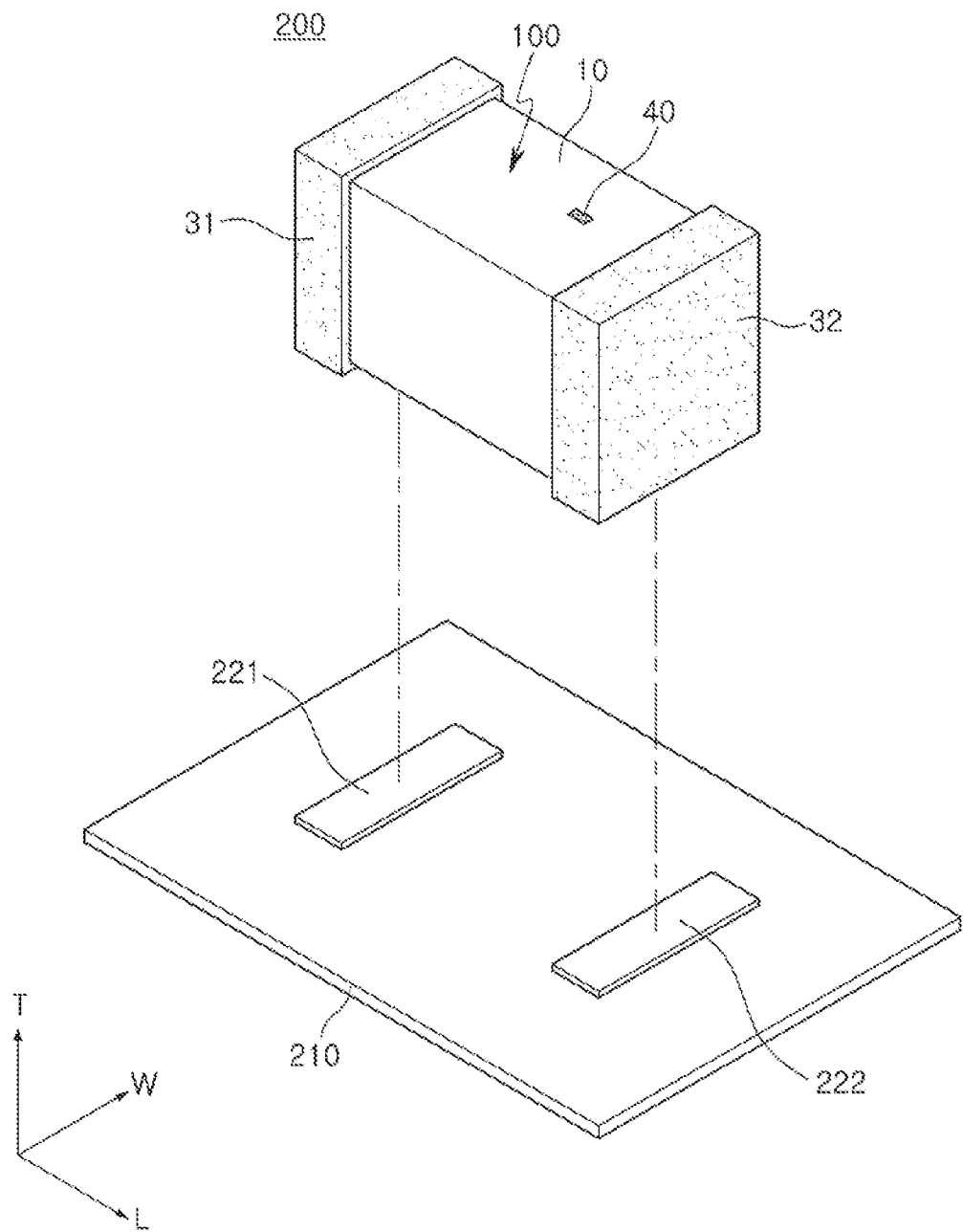
FIG. 3 is a perspective view of a board having a coil electronic component according to another exemplary embodiment.

FIG. 3 is a perspective view of an electronic circuit 200 having the coil electronic component 100 and a circuit board 210 for mounting the coil electronic component 100, according to exemplary embodiment.

As illustrated, in the electronic circuit 200, the coil electronic component 100 may be mounted on the circuit board 210 including first and second terminals 221 and 222 disposed spaced apart from each other on an upper surface of the circuit board 210.

The first and second external electrodes 31 and 32 of the coil electronic component 100 may be electrically connected to the first and second terminals 221 and 222 of the circuit board 210, respectively, using a conductive material (e.g., solder).

Therefore, when the coil electronic component 100 is mounted on the circuit board 210, a user may be able to distinguish the placement and orientation of the coil conductors 22 and 23 and/or the direction of the magnetic flux using the protrusion portion 40.

As set forth above, according to exemplary embodiments in the present disclosure, since in the coil electronic component, the coil disposed on the support member is disposed to be perpendicular to the mounting surface of the body, but the support member includes the protrusion portion extended in the direction perpendicular to the mounting surface of the body, the user may externally determine a placement and orientation of the coil by the naked eyes.

While exemplary embodiments have been shown and described above, it will be apparent to those skilled in the art that modifications and variations could be made without departing from the scope of the present disclosure as defined by the appended claims.

What is claimed is:

1. A coil electronic component, comprising:
   a body;
   first and second external electrodes disposed on opposite surfaces of the body in a first direction parallel to a mounting surface of the body;
   a support member disposed in a second direction perpendicular to the mounting surface of the body and including a protrusion portion extending in the second direction; and
   a coil disposed on at least one surface of the support member.

2. The coil electronic component of claim 1, wherein the protrusion portion is at least partially exposed from the body.

3. The coil electronic component of claim 1, wherein
   the protrusion portion is at least partially exposed on a surface of the body opposite the mounting surface.

4. The coil electronic component of claim 3, wherein the protrusion portion is offset from the center of the surface including the exposed protrusion portion in the first direction.

5. The coil electronic component of claim 3, wherein the surface including the exposed protrusion portion is a diced surface.

6. The coil electronic component of claim 1, wherein a dimension of the body in a third direction perpendicular to the first and second directions is equal to a dimension of the body in the second direction.

7. An electronic circuit, comprising:
   a circuit board having a first surface including first and second terminals; and
   a coil electronic component disposed on the circuit board, wherein the coil electronic component includes
      a body;
      first and second external electrodes disposed on opposite surfaces of the body in a first direction parallel to a mounting surface of the body;
      a support member disposed in a second direction, perpendicular to the mounting surface of the body and including a protrusion portion extending in the second direction; and
      a coil disposed on at least one surface of the support member.

8. The electronic circuit of claim 7, wherein the protrusion portion is at least partially exposed from the body.

9. The electronic circuit of claim 7, wherein
   the protrusion portion is at least partially exposed on a surface of the body opposite the mounting surface.

10. The electronic circuit of claim 9, wherein the protrusion portion is offset from the center of the surface including the exposed protrusion portion in the first direction.

11. The electronic circuit of claim 9, wherein the fourth including the exposed protrusion portion is a diced surface.

12. The electronic circuit of claim 7, wherein a dimension of the body in a third direction perpendicular to the first and second directions is equal to a dimension of the body in the second direction.

* * * * *